United States Patent [19]

Jachowski

[11] Patent Number: 4,726,071
[45] Date of Patent: Feb. 16, 1988

[54] MICROPROCESSOR CONTROLLED SELF-TUNING RESONANT CAVITY AND METHOD

[75] Inventor: Ronald E. Jachowski, Paradise Valley, Ariz.

[73] Assignee: Orion Industries, Inc., Solon, Ohio

[21] Appl. No.: 688,039

[22] Filed: Dec. 31, 1984

[51] Int. Cl.⁴ .................... H01P 7/06; H04J 1/00
[52] U.S. Cl. .................... 455/125; 333/17 R; 333/231; 333/232
[58] Field of Search ............ 333/17 R, 17 M, 32, 333/231, 232; 455/121, 123, 126, 124, 125, 115, 117, 103; 343/861, 862, 865, 703; 329/58 Q, 58 B, 58 C

[56] References Cited

U.S. PATENT DOCUMENTS

| | | | |
|---|---|---|---|
| 2,630,488 | 3/1953 | Clogston | 333/232 |
| 2,934,640 | 4/1960 | Darling | 333/17 R X |
| 3,381,222 | 4/1968 | Gray | 333/17 M |
| 3,480,889 | 11/1969 | Kach | 333/229 |
| 3,673,522 | 6/1972 | Bastikar | 333/209 |
| 3,715,690 | 2/1973 | Young et al. | 333/17 R |
| 3,778,731 | 12/1973 | Oomen | 333/17 R |
| 3,842,358 | 10/1974 | Frazier | 455/115 X |
| 3,882,434 | 5/1975 | Levy | 333/209 |
| 3,891,926 | 6/1975 | Ishman et al. | 455/125 X |
| 4,157,515 | 6/1979 | de Bayser et al. | 333/17 R |
| 4,234,960 | 11/1980 | Spilsbury et al. | 455/123 |
| 4,246,555 | 1/1981 | Williams | 333/209 |
| 4,272,743 | 6/1981 | Evans | 333/17 R X |
| 4,287,466 | 9/1981 | Quick | 455/117 X |
| 4,356,458 | 10/1982 | Armitage | 333/17 M |
| 4,396,896 | 8/1983 | Williams | 333/212 |
| 4,493,112 | 1/1985 | Bruene | 333/17 M X |
| 4,621,242 | 11/1986 | Theall, Jr. et al. | 333/17 M |

FOREIGN PATENT DOCUMENTS

| | | | |
|---|---|---|---|
| 0012656 | 6/1980 | European Pat. Off. | 333/17 R |
| 581533 | 11/1977 | U.S.S.R. | |

Primary Examiner—Eugene R. Laroche
Assistant Examiner—Benny T. Lee
Attorney, Agent, or Firm—Dressler, Goldsmith, Shore, Sutker & Milnamow, Ltd.

[57] ABSTRACT

An external motor is coupled to a tuning rod extending into a resonant cavity of a transmitter combiner. A microprocessor tuning control system generates motor control signals that cause the motor to rotate the tuning rod, varying the resonant frequency of the cavity so as to minimize the reflected power from the cavity. Incident and reflected power are detected by diodes in the transmitter cable connecter of the cavity. The standing wave ratio is computed and composed with a threshold value to determine if the cavity needs to be retuned. The microprocessor effectuates reading of digital numbers representing the incident and reflected power and makes a "best effort" attempt to tune the resonant frequency of the cavity to the transmitter frequency, using the motor to rotate the tuning rod.

26 Claims, 11 Drawing Figures

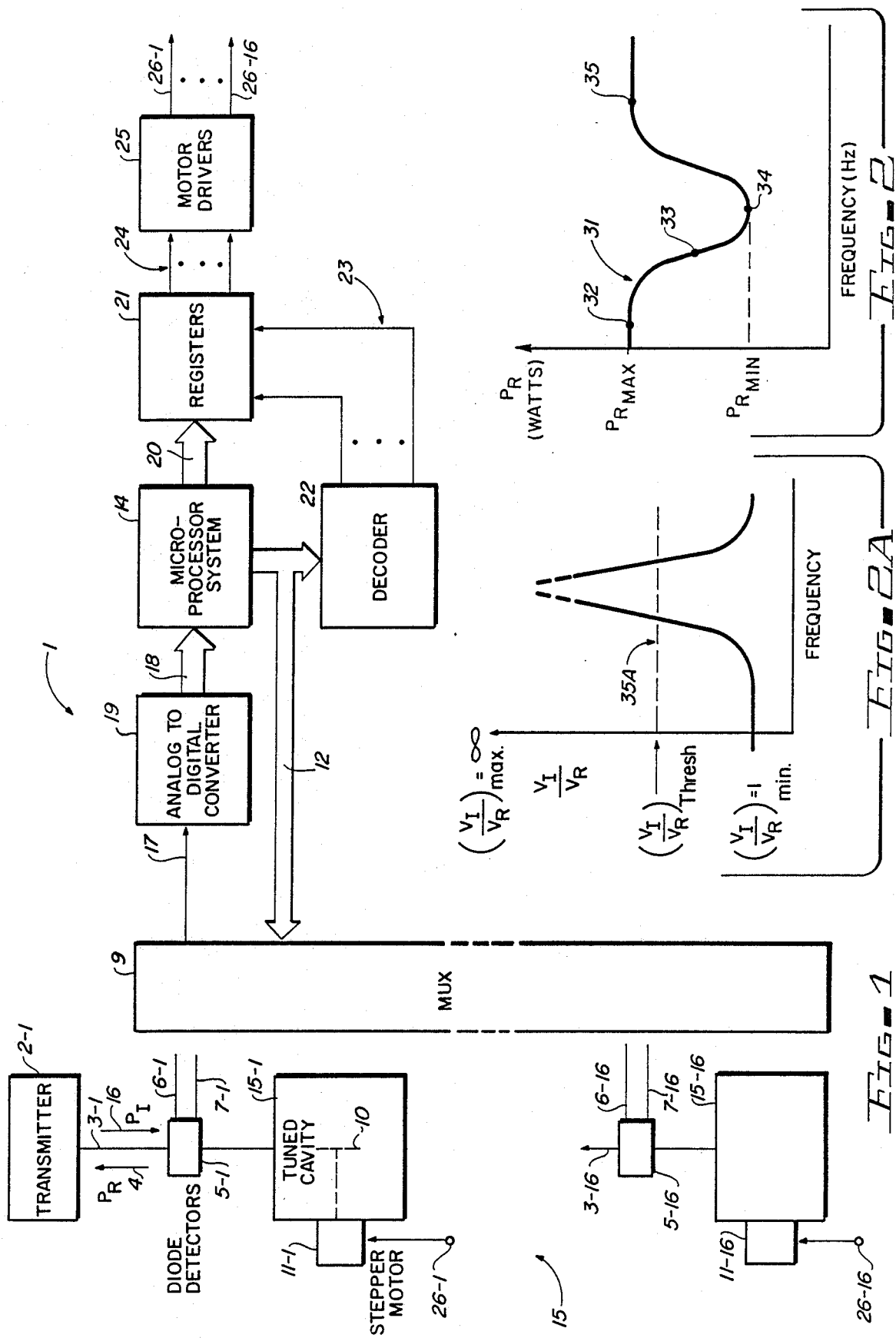

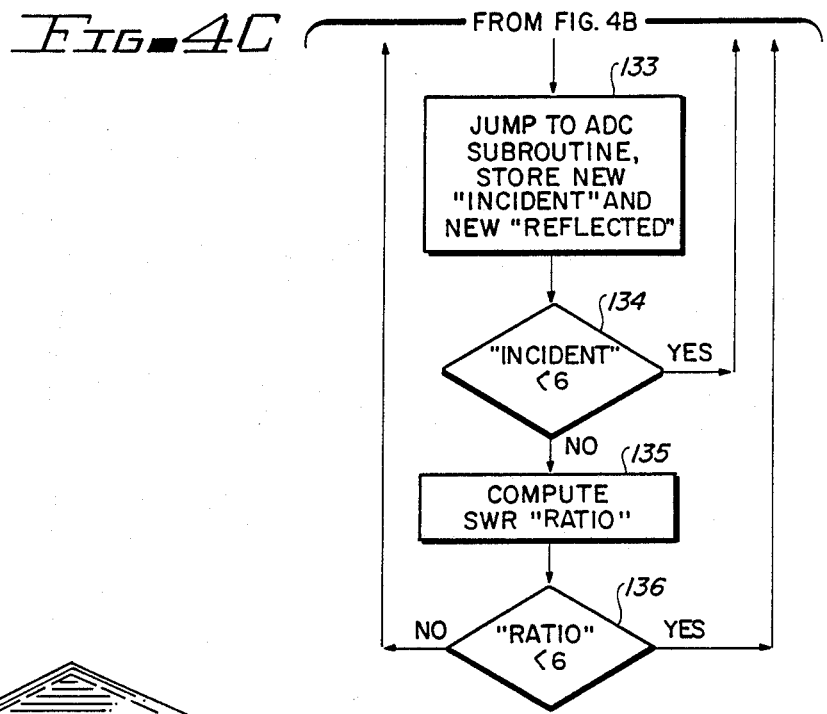
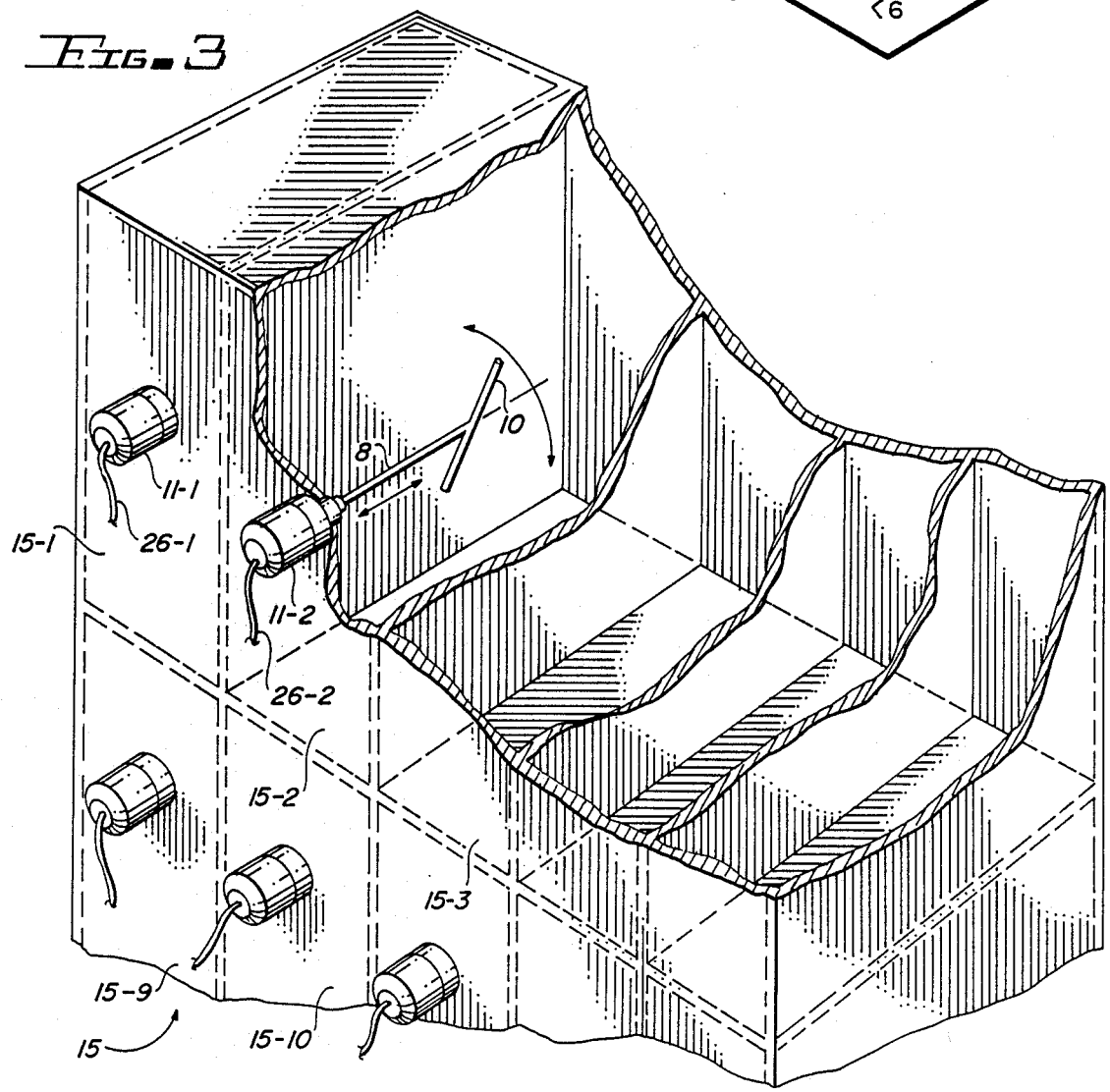

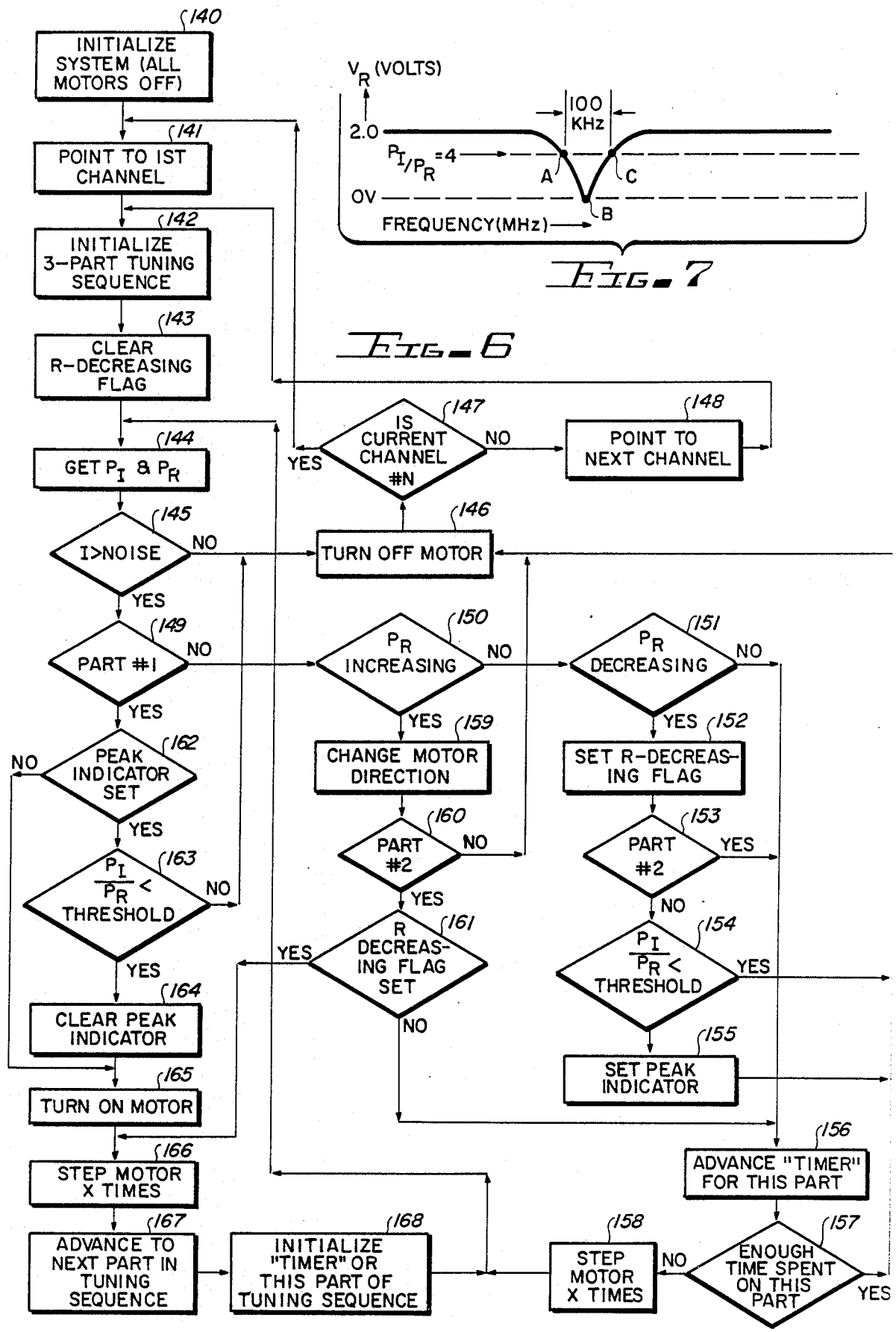

MICROPROCESSOR CONTROLLED SELF-TUNING RESONANT CAVITY AND METHOD

BACKGROUND OF THE INVENTION

The invention relates to methods and apparatus for tuning resonant cavities, and particularly to systems in which reflected power and/or standing wave ratios are sensed by circuitry, especially microprocessor controlled circuitry, to effectuate generating of motor control signals that adjust an internal tuning element in the cavity to minimize power reflected from the cavity.

Transmitter combiners are multiple tuned cavity devices which allow simultaneous transmission of signals from a plurality of transmitters at different but closely spaced frequencies by means of a single antenna. Transmitter combiners include one tuned cavity for each frequency, typically. Each of the tuned cavities is coupled by a coaxial cable to a separate transmitter and is also coupled to a common coaxial connector to which a single antenna cable is connected leading to the antenna. Recently, the mobile telephone communication technology has been rapidly growing. Numerous holders of FCC licenses have established "cells" or regions that are typically several miles in extent, each having low power transmitters generally centered in a particular cell. A major problem that has always existed for transmitter combiners, and for tuned cavities in general, is the fact that numerous external influences cause the tuned cavities to become detuned, substantially increasing their insertion losses and decreasing the amount of transmitter power that reaches the transmitter antenna. Variations in critical dimensions of tuned cavities due to normal changes in the temperature of the cavities has always been a major problem. To avoid detuning of cavities due to temperature, tuned cavities, especially square prism filters, commonly have been made of Invar, which is an expensive metal that must be coated with copper to provide the high surface conductivity required in a tuned cavity that is useful in the high frequency bands assigned for mobile communications. Variations in humidity in many parts of the country are great enough to severely detune the cavities of transmitter combiners, and variations in atmospheric pressure also can significantly detune such cavities. Up to now, there has been no practical means of compensating for such detuning, and users of mobile communications equipment have had to live with the fact that often an inadequate amount of the transmitter power actually reaches the transmitting antenna. Mobile communications systems commonly utilize one of the transmitter channels as a "signaling channel" which controls transmission of messages between the cell site and the mobile units to effectuate switching operations to determine on which channel a particular cell and mobile unit shall operate. If the signaling channel becomes inoperative for any reason, the entire cell becomes inoperative until repairs can be made. Although it is possible to reassign channel frequencies remotely, allowing one of the voice channels to operate as a signaling channel, up to now it has been impossible to remotely make corresponding changes in the resonant frequencies of the various cavities of a transmitter combiner. Therefore, whenever it has been advantageous to reassign channel frequencies, it has been necessary for a technician to travel to the antenna site and manually tune the cavities to the newly assigned transmitter frequencies. This is an expensive and time consuming procedure which it would be very desirable to eliminate.

It is clear that there is a unmet need for an economical, automatic, self-tuning tuned cavity which continuously and automatically self-tunes its resonant frequency to the frequency of the incoming transmitter signal, regardless of the influence of external factors such as temperature, humidity, atmospheric pressure, etc.

SUMMARY OF THE INVENTION

Accordingly, it is an object of the invention to provide an economical tuned cavity that automatically self-tunes its resonant frequency to the frequency of an exciting signal fed into the cavity.

It is another object of the invention to provide a transmitter combiner with the capability of having its transmitter signal frequencies remotely changed without the necessity of manually retuning the resonant frequencies of the corresponding cavities of the transmitter combiner.

It is another object of the invention to provide a transmitter combiner in which all of the tuned cavities are automatically repetitively self-tuned to their respective transmitter frequencies and which occupies a minimum amount of space.

It is another object of the invention to provide a tuned cavity that has a resonant frequency which is stable with respect to an incoming exciting signal regardless of the material of which the cavity is composed and regardless of the influence of external factors such as temperature, humidity, atmospheric pressure, etc.

Briefly described, and in accordance with one embodiment thereof, the invention provides a self-tuning tuned cavity which senses power reflected from the cavity and power incident to the cavity and, in response to the sensed reflected power and incident power, determines whether the cavity needs tuning and generates motor control signals to control the rotation of a motor that displaces a tuning element located inside of the tuned cavity in such a way as to reduce the reflected power, thereby tuning the resonant frequency of the cavity to the frequency of the incident power signal, regardless of the influence of temperature, air humidity, air pressure, etc.

In the described embodiment of the invention, detector diodes in a cable connector receiving incident power from a transmitter cable produce signals indicative of the incident power to the cavity and the power reflected from the cavity. The signals produced by the diodes are converted to digital numbers by an analog-to-digital converter controlled by a microprocessor. The microprocessor, in accordance with a stored tuning program, reads and stores the digital numbers representing the incident power and the reflected power. If the ratio of the reflected power and incident power exceeds a particular threshold, the microprocessor generates motor control pulses applied to a stepper motor that is mechanically coupled through the wall of a tuned cavity to a tuning element therein, modifying the orientation of the tuning element and slightly modifying the resonant frequency of the cavity. The microprocessor repetitively samples the reflected and incident power and generates control pulses to the stepper motor in such a fashion as to minimize the reflected power. Since the reflected power of a tuned cavity is minimum when the resonant frequency is tuned precisely to the frequency of the incident power, the tuned cavity remains tuned precisely to the frequency of the resonant power despite changes in temperature, humidity, air pressure, and other variables which would otherwise result in detuning of the cavity relative to the transmitter frequency. In the described embodiment of the invention, a single microprocessor control system is "time shared" between the stepper motors of a large number of tuned cavities each having a respective stepper motor controlling an internal tuning element. The self-tuning system makes possible maximum coupling of transmitter power through the cavities of a transmitter combiner and conduction thereof to the transmitting antenna, and also makes it possible to conveniently reallocate transmitter channel frequencies without the need to make manual adjustments to the corresponding tuned cavities.

In one described embodiment of the invention, the microprocessor simply computes the standing wave ratio and advances the stepper motor, always in the same direction, until the standing wave ratio exceeds a threshold value, and then simply advances the stepper motor a predetermined number of steps to approximately "center" the resonant frequency of the cavity about the frequency of the incident power.

DESCRIPTION OF THE DRAWINGS

FIG. 1 is a block diagram of a simplified self-tuning transmitter combiner of the present invention.

FIG. 2 is a graph of reflected power of a tuned cavity versus the frequency of the signal exciting the cavity.

FIG. 2A is a graph of the ratio of incident power to reflected power of a tuned cavity versus the frequency of the signal exciting the cavity.

FIG. 3 is a partial cutaway view of an assembly of square prism filters which are automatically self-tuned in response to the microprocessor control system shown in FIG. 1.

FIGS. 4A through 4C constitute a program flow chart of the self-tuning program executed by the microprocessor of FIG. 1.

FIG. 6 constitutes a program flow chart of an improved self-tuning program executed by the microprocessor of FIG. 1 to, in effect, time-share the time of the microprocessor among the plurality of tuned cavities of the transmitter combiner of FIG. 1.

FIG. 7 is a graph useful in explaining a simplified embodiment of the invention.

DESCRIPTION OF THE INVENTION

Figure 4A:
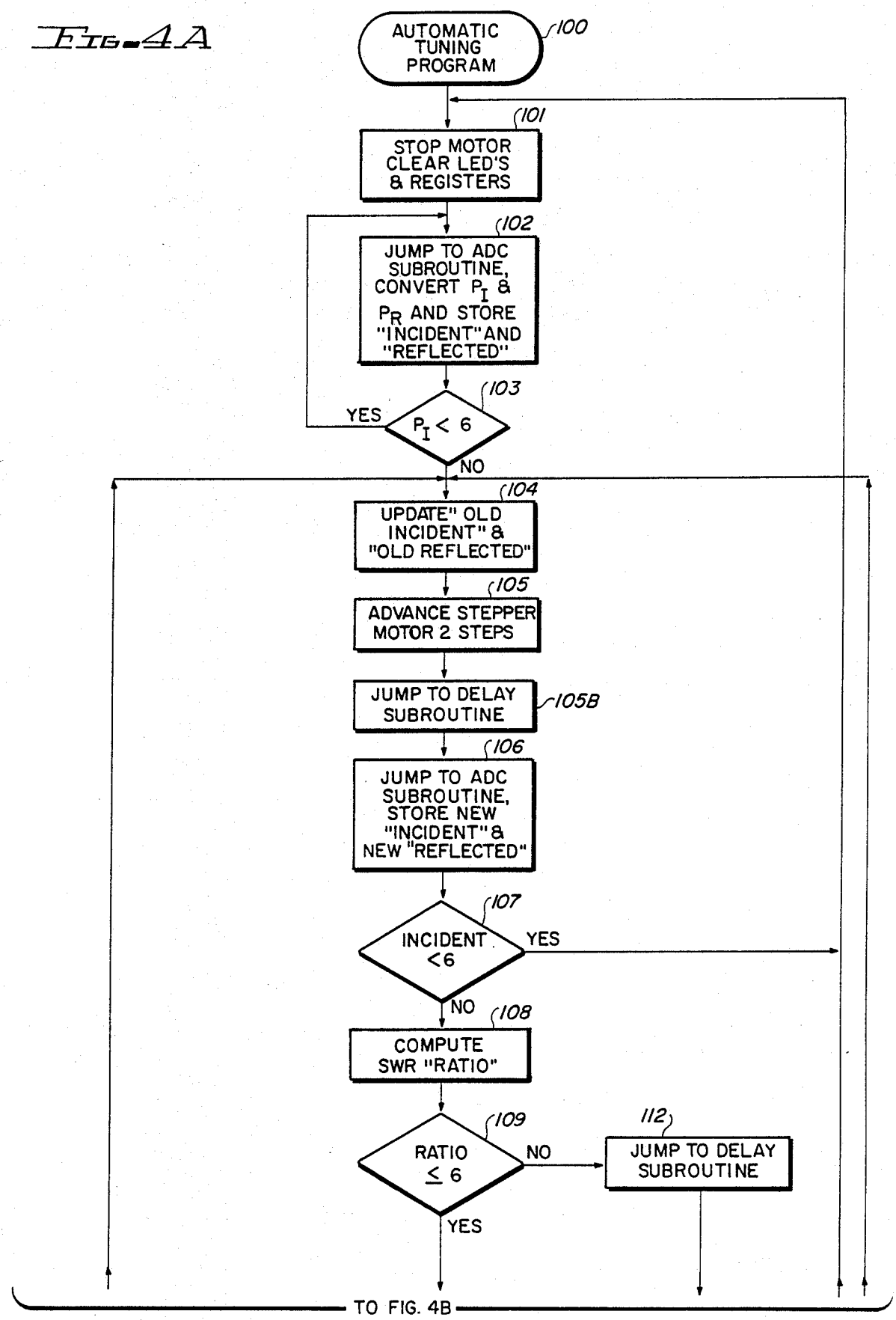

Referring to the drawings, particularly FIGS. 1-3, self-tuning transmitter combiner system 1 includes sixteen tuned cavities collectively referred to by reference numeral 15, and individually referred to by reference numerals 15-1, 15-2...etc The tuned cavities can be of any variety that is externally tunable, for example, the square prism filter cavities described in commonly assigned Pat. No. 4,644,303 entitled "MULTIPLE CAVITY SQUARE PRISM FILTER TRANSMITTER COMBINER WITH SHARED SQUARE WALLS AND TUNING CONTROLS MOUNTED ON RECTANGULAR END WALLS", filed Mar. 13, 1984 by Dickson et al., and incorporated by reference herein, wherein external manipulation of the internal tuning elements is accomplished by control elements located on the non-square faces of the square prism cavities. This structure allows the cavities to be constructed with common or abutting square walls, thereby saving a great deal of space. Alternately, the tuned cavities can be conventional cylindrical cavities with conventional axial tuning stubs. Or, cantilevered tuning elements such as those illustrated in FIG. 3 can be supported by the cylindrical walls of a conventional cylindrical cavity, if desired.

Each of the tuned cavities 15-1, 15-2, etc. in FIG. 1 has an internal tuning element such as 10 coupled by a rod 8 to a stepper motor and reduction drive unit such as 11-1 in FIG. 1.

Each of the cavities 15 has a coaxial input coupled by means of a coaxial cable such as 3-1 to a separate transmitter such as transmitter 2-1. Each of the coaxial cables, which are collectively referred to as cables 3, have a pair of diode detectors such as 5-1 built into it for the purpose of detecting the amount of incident power ($P_I$) indicated by arrow 16 and the amount of reflected power ($P_R$) indicated by arrow 4 flowing in the cable 3. The diode detectors are collectively referred to by reference numeral 5. The two detector diodes in each of the diode detector assemblies 5 produce two voltage signals $V_I$ and $V_R$, respectively, indicative of the amplitude of $P_I$ and $P_R$, respectively.

Each of the pairs of diode detector outputs such as 6-1 and 7-1 are connected to a respective pair of inputs of an analog multiplexer circuit 9.

A selected one of the diode detector output signals is multiplexed to the analog input of an analog-to-digital converter 19 by means of a conductor 17. The resulting digital number produced by analog-to-digital converter 19 is produced on a plurality of conductors 18 that are connected to a microprocessor 14, which is understood to include an appropriate amount of memory, including program storage memory such as electrically programmable read-only memory, (PROM) and data memory, such as high speed random access memory (RAM). Certain outputs 12 of microprocessor 14 are fed into a decoder 22 to produce sixteen selection signals 23 that are connected to "enable" or "select" sixteen separate data registers 21. Some of the conductors 12 are fed back to multiplexer 9, as indicated by reference numeral 12, to allow microprocessor 14 to select which of the 32 (two for each of the sixteen cavities) diode detector signals 6-1, 7-1, etc., are to be coupled to the input of analog-to-digital converter 19. Other outputs 20 of microprocessor 14 are connected to load data into sixteen registers 21, the outputs 24 of which are connected to sixteen motor driver circuits 25. Four of the outputs 24 are connected to each of the stepper motor drivers. The sixteen outputs of motor driver circuits 25 are designated by reference numerals 26-1 through 26-16, and are connected to the control inputs of stepper motors 11-1 through 11-16, respectively.

As will be described in more detail subsequently, microprocessor 14 executes a subroutine that, for one cavity at a time, generates signals on bus 20 and loads them into registers 21 and causes the motor drivers 25 to adjust the orientation of the internal tuning rods 10 so that the tuned cavities are essentially continually kept precisely tuned to predetermined frequencies.

At this point, it will be helpful to refer to FIG. 2, which shows the reflected power ($P_R$) characteristic for a typical tuned cavity. When the cavity is perfectly tuned to the frequency of an exciting signal, the value of the reflected power ($P_R$) is at a minimum, as indicated by point 34 on tuning curve 31. If the cavity is badly out of tune, the value of $P_R$ is high, at points such as 32 and 35. Point 33 indicates an intermediate detuned condition of the cavity.

Those skilled in the art will appreciate that for a particular group of, for example, sixteen tuned cavities, each will have a somewhat different characteristic curve such as the one shown in FIG. 2, and that some cavities in a cluster will "tune up" more precisely than others. As previously mentioned, variations in temperatures of the cavity and in the humidity of the ambient air will cause detuning of a cavity that has been initially tuned under different conditions.

Referring to FIGS. 2 and 2A, the basic operation of the self-tuning transmitter combiner system 1 of FIG. 1 is that the microprocessor system 14 continually samples the diode detector output voltages of each of the sixteen transmitter cables 3 and, if these voltages indicate that there is incident power and that the cavity is out of tune (a cavity is deemed "out of tune" if $V_I/V_r < (V_I/V_R)$ THRESH, where $(V_I/V_R)$ THRESH is an arbitrary but suitable threshold, designated by reference numeral 35A in FIG. 2A), causes the stepper motor to adjust the tuning element of that cavity in such a manner as to minimize the reflected power from that cavity, provided that the transmitter connected to the subject cavity is transmitting a minimum amount of power to it, and provided the standing wave ratio, i.e., the ratio of the incident power to the reflected power exceeds a certain minimum level 35A. If there is no incident power being transmitted to a particular cavity, of course there is no need to tune that cavity. Once the preset threshold value of the standing wave ratio is exceeded, then a subsequently described routine is executed by microprocessor 14 to adjust the position of tuning element 10 until the minimum point 34 (FIG. 2) is obtained for the reflected power sensed by the reflected power diode detector 5 built into the transmitter cable connector.

The foregoing transmitter combiner structure and operation has numerous major advantages over any prior transmitter combiner system. Those skilled in the art will appreciate that maximum transmission of power through a cavity of a transmitter combiner occurs when the cavity is precisely tuned to the transmitter frequency. If the cavity is not tuned to the frequency of the transmitter, then the reflected power is large, and can be equal to the incident power if the cavity is completed detuned because under these conditions, the cavity looks like an open circuit, resulting in all of the incident power being reflected back down the cable to the transmitter. The construction of most square prism filter cavities of expensive, temperature-insensitive, copper clad Invar material, and the use of various bimetal automatic temperature compensating internal tuning elements can be avoided by using the above-described self-tuning system. The self-tuning system allows tuned cavities to be made of very inexpensive material, such as pure copper, without concern for temperature dependence of the dimensions of the cavity.

The above-described self-tuning cavity system avoids the need for factory tuning of the cavity, and avoids the need for a technician to travel to the antenna installation site to manually tune the various cavities of a transmitter combiner both at the intial installation time and at any subsequent time when it is necessary to change transmitter frequencies. The invention avoids the inherent detuning of cavities in climates in which there are great ranges in the ambient temperature, humidity, and/or air pressure which are known to greatly detune transmitter combiners. Another advantage of the self-tuning transmitter combiner of the present invention is that it allows transmitter frequencies to be reassigned by remote control almost instantly, as the self-tuning system of FIG. 1 will automatically cause each of the sixteen cavities to be retuned immediately to the newly-assigned transmitter frequencies. This will enable a communications company to temporarily reassign frequencies that allow a much larger number of subscribers than normal to operate mobile telephones in a particular cell area without overloading the system.

Figure 5A:
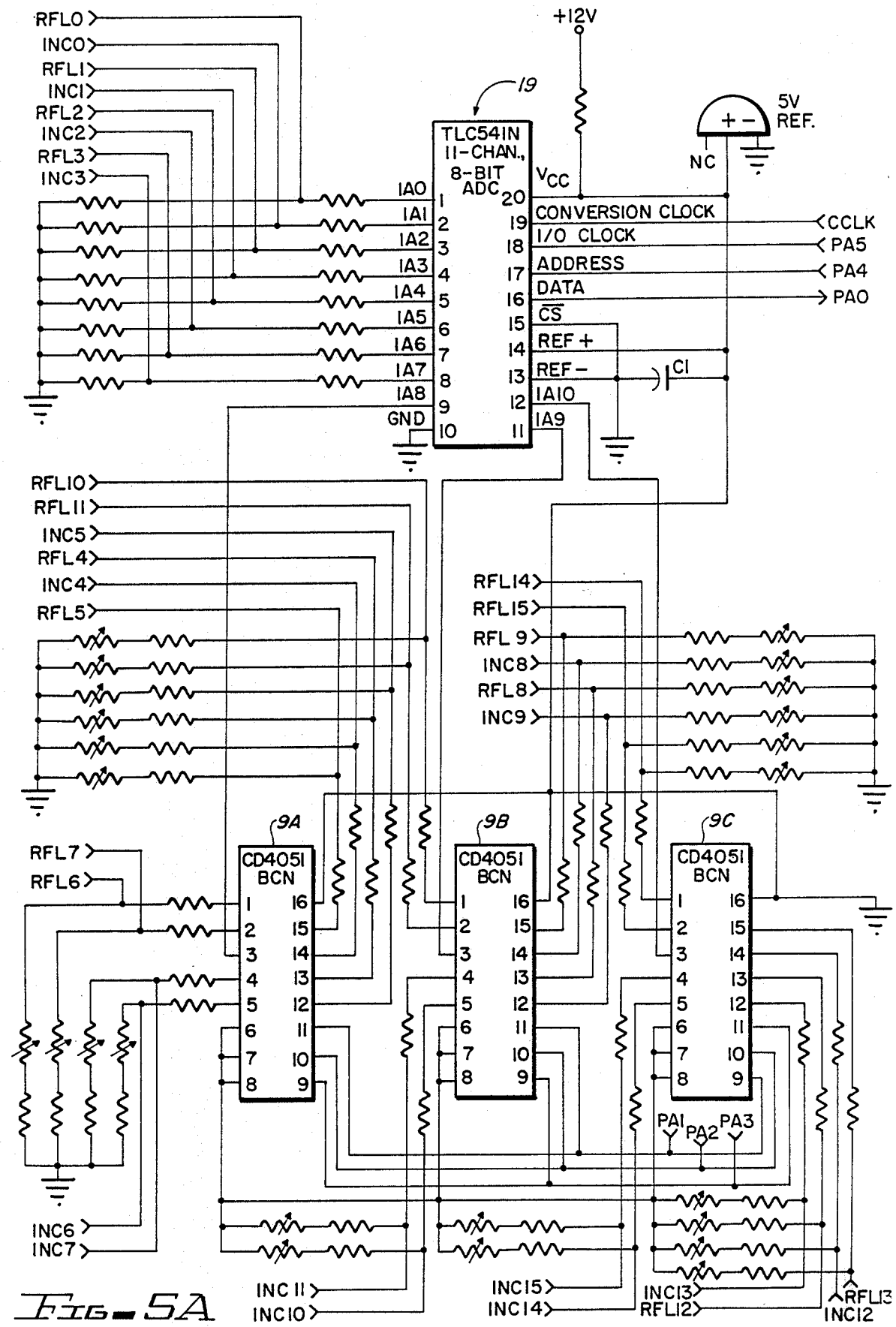
FIGS. 5A and 5B constitute a detailed logic diagram of the microprocessor system of FIG. 1.
Figure 5B:
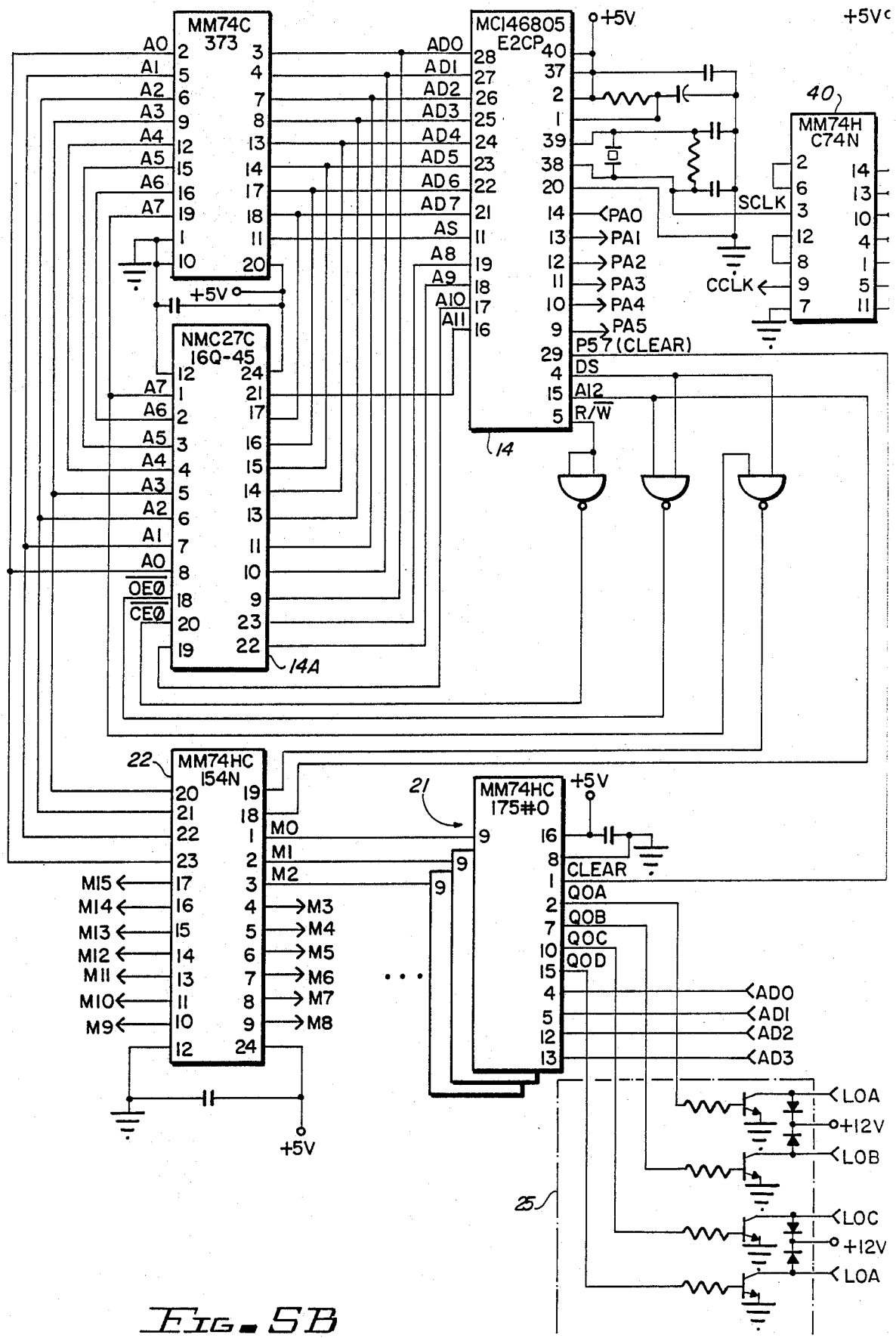

Another advantage of the self-tuning system is that the entire communication system does not automatically fail if the signaling channel (a channel that is used to identify a particular vehicle and instruct its transmitter what frequency it needs in order to make voice contact with the mobile telephone cell) fails, because one of the voice channels can be remotely temporarily reassigned to the frequency of the signaling channel. FIGS. 5A and 5B show a detailed implementation of the system shown in FIG. 1. Where applicable the same reference numerals have been used in FIGS. 5A and 5B as FIG. 1. Microprocessor 14 can be Motorola MC146805E2CP CMOS microcomputer. A clock synthesis circuit 40, which can be a Motorola MM74HC74N integrated circuit, derives the necessary clock signals for the analog-to-digital converter 19 from the microcomputer clock signal on pin 38 of the MC146805E2CP. The crystal, resistor, and two capacitors on pins 38 and 39 of the microcomputer set the microcomputer clock frequency. Analog-to-digital converter 19 can be a TLC541N eight bit analog-to-digital converter manufactured by Texas Instruments. The analog muliplexer 9 is implemented by means of three eight-channel CD4051BCN analog multiplexers manufactured by National Semiconductor (RCA also makes the CD4051) and designated by reference numerals 9A, 9B, and 9C in FIG. 5A. The detector diodes which measure the reflected power produce voltage signals on lines designated RFL0, RFL1 . . . RFL15, and the lines on which the detector diode voltage signals representing the incident power are produced are designated by INC0, INC1, . . . INC15. The various resistors shown in FIG. 5A are used to "low pass filter" the detector diode output signals. The conversion clock for analog-to-digital converter 19 is generated by the clock 9enerator circuit 40. (Note that the potentiometers shown in FIG. 5A are a part of the detectors, not part of the printed circuit board, and they are used to adjust the full scale output voltage range of the detectors.)

Decoder 22 is implemented by means of an MM74HC154N four-to-sixteen line integrated circuit decoder. The program executed by microprocessor 14 is stored in a 2,048×8 bit CMOS electrically programmable read-only memory designated by reference numeral 14A, which can be an NMC27C16Q-45 integrated circuit EPROM manufactured by National Semiconductor. The registers 21 in FIG. 1 are implemented by means of the sixteen MM74HC175 integrated circuit quad D flip flops generally designated by reference numeral 21 in FIG. 5B. The motor drivers 25 can be implemented by means of the descrete power transistor/diode circuits shown within the dotted line 25, or can be implemented by means of ULN2803 driver circuits manufactured by Sprague. The MM74C373 CMOS octal latch in FIG. 5B performs the function of demultiplexing the address and data lines coming from the microcomputer.

Figure 4B:
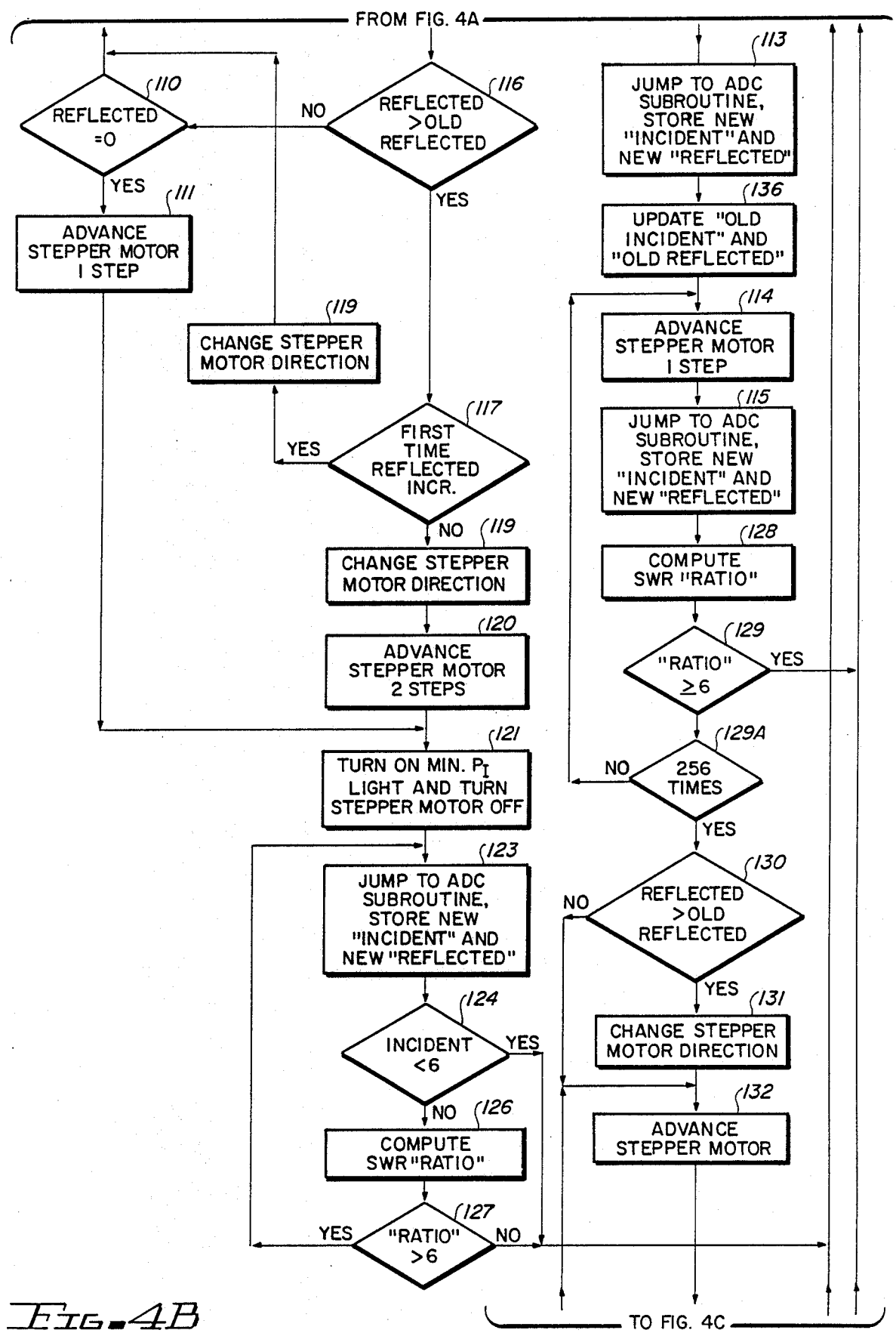

An algorithm that can be executed by microprocessor system 14 to effectuate the above-described operation for a particular tuned cavity is shown in the flow chart of FIGS. 4A and 4B.

Next, two programs executed by microprocessor 14 will be described in detail. The first program described with respect to the flow chart of FIGS. 4A–4C, is an initial program that was written to tune a single cavity. The second program, described with reference to FIG. 6, that was written to tune sixteen cavities by means of a single microprocessor 14. The latter program is more suitable for transmitter combiners, while the former is suitable for applications in which there is only a single cavity.

Referring now to FIGS. 4A–4C, the automatic tuning algorithm is entered at label 100 and immediately enters block 101 and clears the registers 21 and also some light emitting diodes (not shown) that indicate the present system condition, and also stops the stepper motor of the cavity to be tuned. The program then goes to block 102 and obtains the present values of the $P_R$ and $P_I$ for the cavity by executing a subroutine called ADC, which causes multiplexer 9 of FIG. 1 to couple the detector diode outputs to the input of analog-to-digital converter 19 and causes the analog-to-digital converter 19 to produce corresponding digital numbers representing the present values of $P_R$ and $P_I$. Those skilled in the art can readily provide various subroutines that can generate the necessary control signals to multiplexer 9 and analog-to-digital converter 19 to effectuate this foregoing operation.

The same subroutine also causes microprocessor system 14 to read the digital values of $P_R$ and $P_I$ and store them in software registers in the microprocessor memory labelled INCIDENT and REFLECTED, respectively.

The program then enters decision block 103 and determines if the value of the variable INCIDENT, i.e., $P_I$, is less than six. If this determination is affirmative, the program loops back to block 102, but if the decision is negative, the program goes to block 104.

In block 104 the program updates two software registers (stored in the microprocessor memory) named OLD INCIDENT and OLD REFLECTED and assigns to them the values of INCIDENT and REFLECTED, respectively, stored in block 102. Thus, the prior values of $P_I$ and $P_R$ are stored and the microprocessor 14 can now take new readings of $P_I$ and $P_R$ without erasing the old values.

The program then goes from block 104 to 105 and jumps to a subroutine that advances the stepper motor 11 by two steps in a particular direction. The program then causes the microprocessor 14 to jump to a subroutine 105B to create a twenty-four millisecond time delay. Note that the reason for this millisecond time delay is to allow the system enough time for accurate, stable analog to-digital converter readings of $P_I$ and $P_R$.

The program then goes to block 106 and again jumps to the ADC subroutine, reading new values of $P_I$ and $P_R$ converting them to digital members, and storing new values of INCIDENT and REFLECTED. Once the new values of INCIDENT and REFLECTED have been obtained, the program goes to decision block 107 and determines if the new value of INCIDENT is less than six.

If the incident power is determined in block 107 to be greater than six, the program goes to block 108, wherein the microprocessor jumps to a subroutine that calculates the standing wave ratio, i.e., the ratio of the latest value of $P_I$ divided by $P_R$ and sets a variable called RATIO to that value. The program then goes from block 108 to block 109 and determines whether or not the standing wave ratio is greater than or equal to six. If it is not, the program goes to block 112 and causes the system to wait for a twelve millisecond time delay to elapse. The program then goes to block 113 and causes microprocessor 14 to again jump to the ADC subroutine, obtaining new values for $P_I$, $P_R$, INCIDENT, and REFLECTED.

The program then goes to block 136 and, as in block 104 above, updates OLD INCIDENT and OLD REFLECTED with the new values of INCIDENT and REFLECTED, respectively. The program then goes to block 114 and executes a subroutine which causes the stepper motor 11 to advance by one step.

The program then goes to block 115, wherein the microprocessor 14 again executes the ADC subroutine and obtains new values of $P_I$, INCIDENT, and REFLECTED. The program then goes to block 128 and executes the previously mentioned RATIO subroutine which computes a value of RATIO wave ratio based on the latest values of INCIDENT and REFLECTED.

The program then goes to decision block 129 and determines if the new value of RATIO is greater than or equal to six. If this determination is affirmative, the program goes from block 129 back to block 104 and repeats the foregoing loop. If the determination of decision block 129 is negative, i.e., if the standing wave RATIO is less than six, the program goes back to block 114, executes the ADC subroutine, causes the stepper motor to advance one more step, and continues through blocks 115 and 128 and back to decision block 129 as before.

The program contains a software counter which counts the number of times the loop including blocks 114, 115, 128, and 129 is passed through. If this loop is completed 256 times without the standing wave ratio attaining a value of greater than six, as determined by decision block 129A, the program goes to decision block 130. If the standing wave ratio is determined, in decision block 129, to be greater than six, it means that it has exceeded a predetermined threshold, such as the value of point 33 in FIG. 2, and that initial tuning by the stepper motor in response to microprocessor 14 is in the correct direction, and it is time for the program to go into a sequence of instructions that causes the microprocessor to determine tuning rod orientation at which the minimum value of $P_R$ occurs. In other words, from this point on the microprocessor 14 will be looking for a $P_R$ minimum, i.e., a valid "negative peak" such as 34 in FIG. 2.

After decision block 129A has determined that the loop including blocks 114, 115, 128, and 129 has been passed through 256 times and decision block 130 has been entered, the microprocessor determines if the present value of the variable REFLECTED is greater than the earlier stored value of the variable OLD REFLECTED. If this determination is negative, it means that the program has been causing the stepper motor to step in the correct direction, and the program then goes to block 132, causes the stepper motor to advance one step and then proceeds to block 133. In block 133, the program causes the microprocessor 14 to jump to the ADC subroutine and obtain new values of the variable INCIDENT and REFLECTED. The program then goes to block 134 and determines if the new value of INCIDENT is less than six. If this determination is affirmative, the program returns to block 101 and clears the various registers, turns off the light emitting diodes, and stops the stepper motor because the value of INCIDENT is so small that it indicates that there is no significant power being received by the cavity being tuned from the transmitter.

If the determination of decision block 134 is negative, the program goes to block 135 and jumps to the standing wave ratio computing subroutine and computes an updated value of the variable RATIO. The program then goes to decision block 136 and determines if the standing wave ratio is greater than or equal to six. If it is not, the program returns to block 132, and causes the stepper motor to advance one more step. If the determination of decision block 136 is affirmative, the program goes to block 104.

On this next pass through blocks 104 through 109, the determination of decision block 109 will be affirmative. The program will move into a new loop which looks for a valid minimum point such as 34 of the reflected power curve of FIG. 2.

If the above determination of decision block 130 is that the value of REFLECTED is greater than the prior value OLD REFLECTED, it means that the stepper motor is tuning the resonant frequency of the cavity in the wrong direction, moving away from a reflected power minimum point such as 34 FIG. 2. In this event, the program goes to block 131 and changes the direction in which the stepper motor advances and then goes to block 132 and executes the following blocks in the manner previously described.

If the value of the standing wave ratio variable RATIO ever exceeds six, as determined in decision block 129 or 136, an affirmative decision is subsequently made in decision block 109, causing the program to enter decision block 116.

The program then determines if the present value of REFLECTED is greater than OLD REFLECTED, and if this determination is negative, the program goes to decision block 110 and determines if REFLECTED is equal to zero. If this determination is affirmative, it means that the program has found a point very close to the minimum on the reflected power curve of FIG. 2. The program goes to block 111 and causes the stepper motor to advance one more step in the hope of centering the resonant frequency of the cavity in the center of the minimum or negative peak 34 of the reflected power curve of FIG. 2. The program then goes to block 121 and executes an idling routine in which the stepper motor is turned off and a light emitting diode (not shown) indicating that the cavity is precisely tuned is turned on.

If the determination of decision block 116 is that the present value of REFLECTED exceeds the present value of OLD REFLECTED, it means that the reflected power is increasing as a result of the most recent tuning changes. The program then goes to decision block 117 and determines if this is the first time that the reflected power has begun to increase. If this determination is affirmative, the program goes to block 119 and changes the direction of the stepper motor. The program then returns to block 104 and repeats the loop. The next pulse applied to the stepper motor, which will occur in block 105A, will be in the opposite direction toward, but hopefully not past, the center of the negative minimum point of the power reflected curve of FIG. 2.

The determination of decision block 109 will be affirmative on the next pass through the loop, so decision block 116 will be entered again. At some point, the determination of decision block 116 should indicate that REFLECTED is greater than OLD REFLECTED, indicating that the reflected power minimum has been found. The determination of decision block 117 then will be negative, and the program will go to block 119 and jump to a subroutine that changes the direction of the stepper motor. The program then goes to block 120 and causes the stepper motor to advance in the proper direction by two steps. The intent is to step twice at a time while far from the peak ratio to speed up the tuning process and then step one step at a time once the threshold has been crossed and the peak is near. The program then goes from block 120 to 121, turns on the light emitting diode indicating that a valid minimum has been found, and turns the stepper motor off.

The program then goes to block 123 and determines new values of INCIDENT and REFLECTED, and then goes to decision block 124 and determines if the value of INCIDENT is still greater than or equal to six. If this determination is negative, the program goes back to block 101 and waits until the incident power exceeds six. Otherwise, the program goes from decision block 124 to block 126 and computes a new value of RATIO, and then, in decision block 127, tests RATIO to determine if it is greater than or equal to six. If this determination is negative, the program goes to block 101, but if this determination is affirmative, the program returns to block 123 and repeats the above loop.

If the determination of decision block 124 is that RATIO is greater than or equal to six, the program assumes that the cavity is still tuned to the minimum point of the reflected power curve, since the stepper motor has not been advanced in the present loop. The program keeps repeating the loop including blocks 123, 124, 126, and 127 until either the incident power falls below five or the standing wave ratio falls below six.

Referring now to FIG. 6, an "improved" flow chart, which represents the program listed in the printout of Appendix A attached hereto, is shown in which the microprocessor 14 of FIG. 1 is "time shared" among the sixteen cavities that need to be self-tuned. The program of FIG. 6 is entered via label 140, which initializes the system in a conventional manner, setting initial values of various software variables and registers, and turning all stepper motors off. The program then goes to block 141 and sets a software pointer to point to the first channel or cavity. The program then goes to block 142 and initializes a three part tuning sequence effectuated by the program by setting a software variable equal to a value indicating that part 1 of the three part sequence is to be performed next.

Part 1 of the three part sequence involves making a determination of whether the cavity needs to be tuned. If it is already adequately tuned to the transmitter frequency (i.e., if the value of the standing wave ratio exceeds a predetermined threshold), there is no need to turn on the stepper motor for that cavity. Part 2 of the three part tuning sequence involves generating appropriate stepper motor control pulses to orient the tuning element 10 in such a manner as to tune the resonant frequency of the cavity precisely to the transmitter frequency. Part 3 of three part tuning sequence is verifying that the present channel has been properly tuned.

After block 142 (the tuning sequence initialization) has been executed, the program goes to block 143 and clears a flag called the "R-DECREASING" flag. This flag indicates whether the reflected power of the cavity presently being tuned has been observed to decrease as a result of rotation of its stepper motor during the present tuning sequence.

The program then goes to block 144 and executes a subroutine similar to the above-mentioned ADC subroutine and obtains the present values of incident power $P_I$ and reflected power $P_R$. The program then goes to decision block 145 and determines if the present reading of incident power is great enough that it exceeds a maximum noise level expected of the output of the incident power detector.

If the determination of block 145 is negative, the program simply goes to block 146 and turns off the stepper motor of the present cavity. The program then goes to decision block 147 and determines whether the current channel or cavity number is N, where N is the total number of cavities to be self-tuned by the microprocessor system of FIG. 1, in this case 16. If this determination is negative, the program goes to block 148 and points to the next channel or cavity to be self-tuned and then re-enters the loop at block 142. If the determination of decision block 147 is affirmative, the program re-enters the loop at block 141, and points back to the first channel and begins automatic self-tuning of the entire transmitter combiner again.

If the determination of decision block 145 is affirmative, and the determination for the present channel or cavity being pointed to by the program is that there is transmitter power being received, the program then goes to decision block 149 and determines if it is in part 1 of three part tuning sequence. If this determination is affirmative, the program goes to block 162 and determines if a "peak indicator", indicating that reflected power is at a minimum, has been set. If this determination is negative, it means that the cavity is not yet adequately tuned. The program then goes to block 165 and turns on the stepper motor of the present cavity and advances it a predetermined number "X" (typically 1) of steps, as indicated in block 166.

Next the program goes to block 167 and advances the software variable indicating which part of the three part tuning sequence of block 142 is being performed. In this case, it advances it from part 1, which was just completed, to part 2.

If the determination of decision block 162 was that the peak indicator flag is already set, the program goes to decision block 163 and determines if the standing wave ratio $P_I/P_R$ is less than a predetermined threshold, which is typically 4. If this determination is negative, it means that the cavity is already adequately tuned, and the routine goes to block 146, turns off the stepper motor of the present cavity, and advances to the next cavity to be tuned.

It should be appreciated that it is very important to not attempt to adjust the tuning of a cavity that already is quite adequately tuned. It should also be appreciated that it is necessary to use the ratio of $P_I$ and $P_R$ to make the determination as to whether the cavity is reasonably adequately tuned in order to make this determination independent of the transmitter power level, which may vary.

Returning to block 167, after this step has been completed, the program goes to block 168 and initializes a software timer that runs to limit the amount of time (i.e., the number of passes through block 166) spent for part 2 of the tuning sequence. This amount of "time" has been set to be approximately the number of steps needed to be taken by the stepping motor to tune the combiner all the way across its frequency range and back to where it started at the beginning of the 3-part tuning sequence. The timer in block 168 may be set, as a typical value, at approximately 8960 single steps of the motor. Part 2 of the tuning sequence is the part that actually performs the self-tuning operation, generating a sufficient number of stepper motor pulses to orient the tuning element 10 so as to essentially minimize the reflected power.

The program then goes to block 144 and executes the ADC subroutine to obtain new values of $P_I$ and $P_R$.

Once the new values of $P_I$ and $P_R$ are obtained in block 144, the program passes through blocks 145 and 149, as before. Since the program is no longer in part 1 of the three part tuning sequence, the determination of block 149 will be negative, and the program will go to block 150 and test the present value of $P_R$ to determine if it is increasing. Decision block 150 really asks "Is the tuning in the wrong direction?" If the answer in decision block 150 is negative, it means that the tuning may be progressing in the desired direction, and the program goes to decision block 151, which asks the opposite question, i.e., "Is tuning in the correct direction?" If this determination is negative, it corresponds to a "can't determine" condition, and the program goes to block 156 and advances the software "timer" that was initialized in block 168. A "can't determine" condition occurs when no change in $P_R$ is detected or when the accumulated change in $P_R$ since either the last "valid" change or the first measurement is less than some maximum noise level expected from the detector and analog-to-digital conversion circuitry. A "valid" change is any accumulated change greater than the maximum noise level expected (represented by the constant "NOISE" in the program).

The program then goes to decision block 157 and determines if enough "time" or motor steps have been taken in this part of the three part tuning sequence. If this determination is negative, the program goes to block 158, advances the stepper motor, gets back into the loop at block 144, and repeats. If the allocated number of motor steps have already been performed in part 2 of the three part tuning sequence, the program goes to block 146, turns off the stepper motor of the cavity being tuned, and moves on to the next cavity, as previously described.

If the determination of decision block 151 is affirmative, this means that present tuning of the cavity is in the correct direction, and the program goes to block 152 and sets the "reflected power decreasing" flag that was cleared in block 143. The program then goes to decision block 153 and determines if the present stage of the three part tuning sequence is part 2. The first time through decision block 153, the determination will be affirmative, and the program will go through block 156 and decision block 157 as described above. If the determination of block 153 is negative, it means that the reflected power has been found to be at a minimum. The program then goes to decision block 154 and determines if the standing wave ratio is less than the threshold (in this case, defined as 4).

In block 154, if the standing wave ratio $P_I/P_R$ is greater than or equal to the predetermined threshold, the determination is negative. This means that the standing wave ratio is at a high level while, in addition, the reflected power is at a minimum. These are the desired conditions indicating that the present cavity is quite adequately and precisely tuned to the transmitter frequency, so the peak indicator flag is set in block 155, the stepper motor of the present cavity is turned off, and the program goes to the next cavity. If the determination of decision block 154 is affirmative, the stepper motor then is turned off, because the program has tuned up the present cavity as well as it can at the moment and therefore will not spend any more microprocessor time on this cavity at this time (i.e., the cavity is "precisely", but not "adequately" tuned).

If the determination of decision block 154 is negative, it means that the cavity is both adequately and precisely tuned. The program then goes to block 155 and sets the peak indicator flag that was tested in block 162 and possibly cleared in block 164, and then goes to block 146 and turns off the stepper motor of the cavity presently being tuned and moves on to the next cavity.

If the determination in decision block 150 is affirmative, it means that tuning is in the wrong direction on the curve of FIG. 7, and that the reflected power minimum 34 in FIG. 2 has been passed. The program therefore goes to block 159 and changes the stepper motor direction. The program then goes to decision block 160 and determines if the program is in part 2 of the three part tuning sequence. If this determination is negative, the program goes to block 146, turns off the stepper motor, and moves on to the next cavity to be tuned. If the determination of decision block 160 is affirmative, the program goes to block 161 and checks the reflected power decreasing flag to see if it is set. On the first pass through decision block 161, this flag is probably set in accordance with prior execution of block 152. If the determination of decision block 161 is affirmative, it means that tuning is in the correct direction, and the program goes to block 166, increments the stepper motor and continues. If this is done, the program then goes to block 167 and advances to the next part of the three part tuning sequence. The next pass then would result in a negative decision in either decision block 160 or 153.

If the determination of decision block 161 is negative, the program goes to block 156, advances the software "timer" for the present part of the three part tuning sequence, and advances the stepper motor and gets back in the loop at block 144 or turns off the stepper motor and advances to the next cavity to be tuned, depending upon whether or not the allocated "time" for this cavity has been spent.

Although the above-described algorithms can result in extremely precise tuning of each of the cavities in a transmitter combiner, as a practical matter it has been found that much less precision in tuning of the cavities is needed than is produced by means of the programs of FIGS. 4A-4C, and 6. In fact, adequate tuning can be achieved with a much simpler tuning technique that always rotates the tuning element 10 in the same direction and does not reverse directions. A minimum in the reflected power, i.e., optimum tuning of the cavity, occurs at successive positions of the tuning element 10 that are 90° apart. That is, once a reflected power minimum is obtained, another identical reflected power minimum will occur if the tuning element 10 is rotated another 90°. Therefore, instead of using the above-described, somewhat complex routines (which cause the stepper motor to rotate past the reflected power minimum such as 34 in FIG. 2 and then "back up" to center the tuning element in the reflected power minimum), adequate and precise tuning can be achieved by causing the stepper motor to continue rotating in the original direction by slightly less than 90°.

As a practical matter, it has been found that the voltage $V_R$, i.e., the voltage produced by the reflected power detector diode, has a characteristic similar to the one shown in FIG. 7. With the range setting resistors of the reflected power diodes adjusted so that when the cavity is badly out of tune, $V_R$ (the voltage produced by the reflected power diode) is about two volts, then, when the tuning element 10 is positioned so that the resonant frequency of the cavity is equal to the incoming transmitter or excitation signal, $V_R$ falls to a level of approximately 30 to 50 millivolts, at a point such as B in FIG. 7. Points A and C designate the values of $V_R$ at which the standing wave ratio $P_I/P_R$ is equal to 4 (regardless of the transmitter power level). The frequency difference between points A and C is only approximately 100 kilohertz. For the particular stepper motors being used, each step produces a change of approximately 10 kilohertz per step of the stepper motor 11.

In the simplified method of operation, microprocessor 14 simply alternately steps the stepper motor ahead and then compares the standing wave ratio to a fixed threshold value of, for example, 4. At points A and C on the reflected power voltage curve of FIG. 7, the cavity is already fairly closely tuned to the transmitter frequency exciting that cavity, as the standing wave ratio is about 4 at those points. Microprocessor 14 then simply advances the stepper motor of the cavity being tuned a fixed number of steps in the same direction. It has been found that only one or two additional steps of the stepper motor comes very close to centering the curve of FIG. 7 so that point B is equal to the transmitter frequency.

The above-described embodiments of the invention have all been constructed and tested in prototype experiments. The last described embodiment of the invention avoids the problems of rather high amounts of system noise generated as a result of the experimental transmitter being used in the experiments, and has been found to result in reasonably fast, reasonably precise, and reasonably continuous tuning of all cavities receiving incident power from their respective transmitters. The self-tuning time of each cavity is very short.

While the invention has been described with reference to a particular embodiment thereof, those skilled in the art will be able to make various modifications to the described embodiments of the invention without departing from the true spirit and scope thereof. It is intended that all self-tuning apparatus and methods which are equivalent to those described in that they perform substantially the same function in substantially the same way to accomplish substantially the same result be encompassed within the invention. Although a digital approach to self-tuning of a cavity has been described herein, it would be possible, and in some instances entirely practical, to use primarily analog circuitry to generate feedback signals which control a servo motor to orient the tuning element 10 so that it minimizes the reflected power.

APPENDIX A

```
* SOFTWARE FOR A SELF TUNING, N CHANNEL, MICROWAVE COMBINER
*
* 10/11/84                                    CO.
* COPYRIGHT 1984 --- ANTENNA SPECIALISTS,
*----------------------------------------------------------
*
*----------------------------------------------------------
*              SYMBOL TABLE
*----------------------------------------------------------
      04     NOISE         EQU    4            *# OF LSBs OF NOISE IN SYSTEM
             *                                 * (1 LSB = 10 MILLIVOLTS)
      04     NUM.STEPS     EQU    4            *# MOTOR STEPS/MOTOR MOVE.
      00     REGISTERS     EQU    0            *MEMORY MAP-INTERNAL REGISTERS
      10     RAM           EQU    $10          * --START OF INTERNAL RAM
      40     STACK         EQU    $40          * --BEGINNING OF STACK RAM
      7F     STKBTM        EQU    $7F          * --BOTTOM OF STACK
      80     EXT.MEM       EQU    $80          * --"START" OF EXTERNAL MEMORY
    1000     EPROM         EQU    $1000        * --START OF EPROM DATA
    1040     MAIN          EQU    $1040        * --START OF EPROM PROGRAM
    1FF6     INTTBL        EQU    $1FF6        * --START OF INTERRUPT TABLE.
      FE     DEFDA         EQU    11111110B    *DEFINE PORT A & B DIRECTIONS.
      FF     DEFDB         EQU    11111111B    * --INPUT=0,  OUTPUT=1.
      00     INIT.ADC      EQU    0            *INITIALIZE PORT A & B VALUES.
      00     INIT.MOTORS1  EQU    0
      80     INIT.MOTORS2  EQU    $80
      01     DMASK         EQU    1            *ADC DATA BIT MASK FOR PORT A.
      05     CLK           EQU    5            *ADC I/O CLOCK BIT # IN PORT A.
      06     CSBAR         EQU    6            *ADC SELECT BIT # IN PORT A.
      03     LOCATION      EQU    00000011B    *STATUS WORD MASKS--LOCATION
      04     ROTATION      EQU    00000100B    * --MOTOR DIRECTION FLAG
      08     PEAK          EQU    00001000B    * --PEAK POWER RATIO FLAG
      FC     NOT.LOC       EQU    11111100B    * --"AND" MASK FOR LOCATION
      F7     PEAK.CLEAR    EQU    11110111B    * --"AND" MASK FOR PEAK FLAG
      10     NUM.MOTORS    EQU    16           *NUMBER OF MOTORS IN SYSTEM
      28     DELAYA        EQU    40           *MOTOR STEPPING DELAYS:
      27     DELAYB        EQU    39           *   10ms=40,39;   5ms=1,235;
                                               *   2.5ms=1,116;
                                               *   1ms is too fast for motors
      08     COUNT2H       EQU    8            *MAX # TIMES TO LOOK FOR PEAK
      CA     COUNT2L       EQU    192          *   = 2240 TIMES.
      00     COUNT3H       EQU    0            *MAX # TIMES TO TRY TO VERIFY
      FF     COUNT3L       EQU    255          *   PEAK = 255 TIMES.
*----------------------------------------------------------
*              VARIABLE TABLE
*----------------------------------------------------------
      00                   ORG    REGISTERS    *START OF SYSTEM MEMORY MAP
0000         ADC           RMB    1            *PORT A--THE A-TO-D CONVERTOR
0001         PORTB         RMB    1            *PORT B--MOSTLY UNUSED.
0002                       RMB    2            *EXTERNAL MEMORY--UNUSED
0004         DIRA          RMB    1            *DIRECTION REGISTERS FOR PORTS
0005         DIRB          RMB    1
0006                       RMB    2            *EXTERNAL MEMORY--UNUSED
0008         TDATA         RMB    1            *TIMER DATA REGISTER--UNUSED
0009         TCNTRL        RMB    1            *TIMER CONTROL REGISTER-UNUSED
000A                       RMB    6            *EXTERNAL MEMORY--UNUSED
      10                   ORG    RAM          *VARIABLES
0010         DLY1          RMB    1            *MEMORY FOR DELAY ROUTINE
0011         DLY2          RMB    1
0012         ADDR          RMB    1            *MEMORY FOR ADC CONVERSION
0013         ADCA          RMB    1
0014         NADDR         RMB    1
```

```
0015            DATA       RMB    1
0016            STEPS      RMB    1              *MEMORY FOR AUTOMATIC TUNING
0017            INCIDENT   RMB    1
0018            REFLECTED  RMB    1
0019            STATUS     RMB    NUM.MOTORS
0029            ASAVE      RMB    1
002A            XS+        RMB    1
002B            RD.FLAG    RMB    1
002C            HR         RMB    1
002D            LR         RMB    1
002E            FR         RMB    1
002F                       RMB    1   *UNUSED
0030            PRODUCT    RMB    1              *MEMORY FOR THRESHOLD CHECK
0031            DATA.CYCLE RMB    1              *MORE MEMORY FOR ADC ROUTINE
0032            STEP.COUNT RMB    1              *MEMORY FOR MOTOR STEPPING
0033            LAST.LOC   RMB    1
0034            COUNTH     RMB    1              *MORE MEMORY FOR "AUTOMATIC"
0035            COUNTL     RMB    1
0036                       RMB    10             *UNUSED
        80                 ORG    EXT.MEM
0080            MOTORS     RMB    NUM.MOTORS     *EXTERNAL MOTOR REGISTERS
*---------------------------------------
*               TABLE OF CONSTANTS
*---------------------------------------
        1000               ORG    EPROM
1000 0509       FSTEP      FCB    0101B,1001B    *MOTOR STEPPING SEQUENCE
1002 0A06                  FCB    1010B,0110B
*---------------------------------------
*
*               PROGRAM CODE
*---------------------------------------
        1040               ORG    MAIN
1040 9B         RESET:     SEI                   *INHIBIT INTERRUPTS
1041 A6 FE                 LDA    #DEFDA         *PROGRAM I/O PORT DIRECTIONS.
1043 B7 04                 STA    DIRA
1045 A6 FF                 LDA    #DEFDB
1047 B7 05                 STA    DIRB
1049 A6 00                 LDA    #INIT.ADC      *INITIALIZE I/O BIT VALUES.
104B B7 00                 STA    ADC
104D A6 00                 LDA    #INIT.MOTORS1  *(TURN OFF ALL MOTORS.
104F B7 01                 STA    PORTB
1051 AE 0F                 LDX    #NUM.MOTORS-1  *INITIALIZE STATUS OF MOTORS.
1053 4F                    CLRA
1054 E7 19     INIT.STATUS: STA   STATUS,X
1056 5A                    DECX
1057 2A FB                 BPL    INIT.STATUS
1059 A6 80                 LDA    #INIT.MOTORS2  *(ENABLE MOTORS TO TURN ON.)
105B B7 01                 STA    PORTB
105D CC 1080               JMP    AUTOMATIC      *BEGIN AUTOMATIC TUNING.
*---------------------------------------
1080 AE 10     AUTOMATIC:  LDX    #NUM.MOTORS    *GET # OF MOTORS.
1082 58                    LSLX                  *TWICE AS MANY DETECTORS.
1083 5A        NEW.MOTOR:  DECX                  *POINT TO INCIDENT DETECTOR.
1084 A6 02                 LDA    #2             *INITIALIZE TUNING SEQUENCE.
1086 B7 16                 STA    STEPS
1088 CC 109A               JMP    CLR.FLAG
109A 3F 2B     CLR.FLAG:   CLR    RD.FLAG        *CLEAR "DECREASING" FLAG.
109C CD 1200   NEXT.DATA:  JSR    GET.DATA       *MEASURE INCIDENT & REFLECTED.
109F B6 17                 LDA    INCIDENT       *IF 1<= NOISE,TUNE NEXT MOTOR,
10A1 A1 04                 CMP    #NOISE
10A3 22 03                 BHI    TUNE           *ELSE TUNE THIS MOTOR.
10A5 CC 113E               JMP    NEXT.MOTOR
10A8 B6 16     TUNE:       LDA    STEPS          *IF STEP #1 THEN DO IT.
10AA A1 02                 CMP    #2
```

```
10AC 27 10              BEQ    STEP1
10AE B6 18              LDA    REFLECTED
10B0 B1 2C              CMP    HR               *IF NEW R > HIGHEST R,
10B2 22 49              BHI    CHECK.INCR       *THEN CHECK IF R INCREASING,
10B4 B1 2D              CMP    LR               *ELSE IF NEW R < LOWEST R,
10B6 25 60              BLO    CHECK.DECR       *THEN CHECK IF R DECREASING,
10B8 CC 11C0            JMP    UPDATE.COUNT     *ELSE UPDATE THIS STEP'S TIMER
*------------------------------------------------------------------
10C4 54       STEP1:    LSRX                    *STEP#1
10C5 E6 19              LDA    STATUS,X         *IF NOT AT "PEAK",
10C7 58                 LSLX                    *THEN GO TO NO.PEAK,
10C8 A1 08              CMP    #PEAK
10CA 25 12              BCS    NO.PEAK
10CC B6 18              LDA    REFLECTED        *ELSE, IF (I/R)>= THRESHOLD,
10CE CD 1170            JSR    CHECK.THRESH
10D1 22 03              BHI    BELOW.THRESH
10D3 CC 113E            JMP    NEXT.MOTOR       *THEN TUNE NEXT MOTOR,
10D6 54       BELOW.THRESH: LSRX                *ELSE, CLEAR PREVIOUS "PEAK".
10D7 A6 F7              LDA    #PEAK.CLEAR
10D9 E4 19              AND    STATUS,X
10DB E7 19              STA    STATUS,X
10DD 58                 LSLX
10DE B6 18    NO.PEAK:  LDA    REFLECTED        *INITIALIZE "FIRST","HIGHEST",
10E0 B7 2E              STA    FR               *AND "LOWEST" REFLECTED POWER
10E2 B7 2C              STA    HR               *VALUES.
10E4 B7 2D              STA    LR
10E6 CC 11E4            JMP    MOTOR.ON         *STEP MOTOR & ADVANCE SEQUENCE
10FD B7 2C    CHECK.INCR: STA  HR               *IF REFLECTED POWER IS
10FF B0 2E              SUB    FR               *NOT INCREASING,
1101 A1 04              CMP    #NOISE
1103 23 47              BLS    FIX2             *THEN INCR THIS STEP'S TIMER,
1105 B6 18              LDA    REFLECTED        *ELSE, UPDATE VALUES OF R,
1107 B7 2E              STA    FR
1109 B7 2D              STA    LR
110B CD 1180            JSR    CHANGE.DIR       *AND CHANGE MOTOR DIRECTION.
110E B6 16              LDA    STEPS
1110 27 2C              BEQ    NEXT.MOTOR       *IF STEP#3, TUNE NEXT MOTOR.
1112 B1 2B              CMP    RD.FLAG          *IF STEP#2 & R HAS DECREASED,
1114 27 39              BEQ    FIX3             *THEN STEP MOTOR & ADVANCE SEQ
1116 20 38              BRA    FIX2             *IF STEP#2 & R HASN'T
              *PREVIOUSLY DECREASED, THEN ADVANCE TIMER,ETC.
1118 B7 2D    CHECK.DECR: STA  LR               *IF R ISN'T DECREASING,
111A B0 2E              SUB    FR
111C 40                 NEG
111D A1 04              CMP    #NOISE
111F 23 2B              BLS    UPDATE.COUNT     *THEN UPDATE STEP TIMER,
1121 B6 18              LDA    REFLECTED        *ELSE, UPDATE R VALUES...
1123 B7 2E              STA    FR
1125 B7 2C              STA    HR
1127 A6 01              LDA    #1               *AND SET "DECREASING" FLAG.
1129 B7 2B              STA    RD.FLAG
112B B6 16              LDA    STEPS            *IF STEP #2,
112D 26 1D              BNE    UPDATE.COUNT     *THEN UPDATE STEP TIMER, ETC.
112F B6 18              LDA    REFLECTED        *IF STEP #3...
1131 CD 1170            JSR    CHECK.THRESH     *AND (I/R)<THRESHOLD,
1134 22 08              BHI    NEXT.MOTOR       *THEN GO TUNE NEXT MOTOR.
1136 54       SET.PEAK: LSRX                    *IF STEP#3 & (I/R)>=THRESHOLD,
1137 A6 08              LDA    #PEAK            *THEN FOUND PEAK.
1139 EA 19              ORA    STATUS,X         *SET PEAK INDICATOR...
113B E7 19              STA    STATUS,X         *AND TUNE NEXT MOTOR.
113D 58                 LSLX
113E 54       NEXT.MOTOR: LSRX                  *TURN OFF THE CURRENT MOTOR.
113F A6 00              LDA    #OFF.MOTOR
```

```
1141 E7 80                    STA   MOTORS,X
1143 58                       LSLX              *IF NOT POINTING TO LAST MOTOR
1144 26 03                    BNE   NEXT.CHAN   *THEN POINT TO NEXT & TUNE IT,
1146 CC 1080                  JMP   AUTOMATIC   *ELSE POINT TO FIRST & TUNE IT
1149 CC 1083  NEXT.CHAN:      JMP   NEW.MOTOR
*------------------------------------------------------------
1150 CC 11C0  FIX2:           JMP   UPDATE.COUNT
1153 CC 1190  FIX3:           JMP   CONT.SEQ
*------------------------------------------------------------
1170 A1 55    CHECK.THRESH:   CMP   #85         *IF (I/R)>3, SET CARRY FLAG.
1172 22 07                    BHI   BELOW       *IF (I/R)=3, SET ZERO FLAG.
1174 B7 30                    STA   PRODUCT
1176 48                       LSLA
1177 BB 30                    ADD   PRODUCT
1179 B1 17                    CMP   INCIDENT
117B 81       BELOW:          RTS
*------------------------------------------------------------
1180 B7 29    CHANGE.DIR:     STA   ASAVE       *CHANGE DIRECTION OF MOTOR...
1182 54                       LSRX              *ROTATION BY CHANGING...
1183 E6 19                    LDA   STATUS,X    *DIRECTION FLAG IN MOTOR...
1185 A8 04                    EOR   #ROTATION   *STATUS INFORMATION BYTE.
1187 E7 19                    STA   STATUS,X
1189 B6 29                    LDA   ASAVE
118B 58                       LSLX
118C 81                       RTS
*------------------------------------------------------------
1190 CD 1300  CONT.SEQ:       JSR   STEP.MOTOR  *STEP MOTOR SET # OF STEPS.
1193 B6 16                    LDA   STEPS       *ADVANCE TO NEXT STEP IN SEQ.,
1195 4A                       DECA              *AND INITIALIZE ITS TIMER.
1196 27 0D                    BEQ   INIT.COUNT3
1198 B7 16                    STA   STEPS
119A A6 08                    LDA   #COUNT2H
119C B7 35                    STA   COUNTH
119E A6 CA                    LDA   #COUNT2L
11A0 B7 34                    STA   COUNTL
11A2 CC 11E0                  JMP   FIX1
11A5 B7 16    INIT.COUNT3:    STA   STEPS
11A7 A6 00                    LDA   #COUNT3H
11A9 B7 35                    STA   COUNTH
11AB A6 FF                    LDA   #COUNT3L
11AD B7 34                    STA   COUNTL
11AF 5C                       INCX              *(PREVIOUS ERROR!)
11B0 CC 109C                  JMP   NEXT.DATA
*------------------------------------------------------------
11C0 B6 34    UPDATE.COUNT:   LDA   COUNTL      *IF CURRENT STEP IN TUNING...
11C2 A0 01                    SUB   #1          *HAS BEEN EXECUTED PRESET #...
11C4 B7 34                    STA   COUNTL      *OF TIMES, THEN TUNE NEXT...
11C6 B6 35                    LDA   COUNTH      *MOTOR, ELSE STEP MOTOR A...
11C8 A2 00                    SBC   #0          *SET # OF STEPS AND GO...
11CA B7 35                    STA   COUNTH      *MEASURE NEW I AND R.
11CC 24 03                    BCC   TURN.MOTOR
11CE CC 113E                  JMP   NEXT.MOTOR
11D1 CD 1300  TURN.MOTOR:     JSR   STEP.MOTOR
11D4 5C                       INCX              *(PREVIOUS ERROR!)
11D5 CC 109C                  JMP   NEXT.DATA
*------------------------------------------------------------
11E0 5C       FIX1:           INCX
11E1 CC 109C                  JMP   NEXT.DATA
*------------------------------------------------------------
11E4 BF 2A    MOTOR.ON:       STX   XSAVE       *TURN ON MOTOR.
11E6 54                       LSRX
11E7 E6 19                    LDA   STATUS,X
11E9 A4 03                    AND   #LOCATION
```

```
11EB  97                         TAX
11EC  D6 1000                    LDA    FSTEP,X
11EF  BE 2A                      LDX    XSAVE
11F1  54                         LSRX
11F2  E7 80                      STA    MOTORS,X
11F4  BE 2A                      LDX    XSAVE
11F6  CC 1190                    JMP    CONT.SEQ      *STEP MOTOR & ADVANCE SEQUENCE
              *------------------------------------------------------------
1200  BF 12    GET.DATA:         STX    ADDR          *SAVE(INCIDENT)DETECTOR ADDRES
1202  9F                         TXA
1203  AE 03                      LDX    #3            *INITIALIZE 3 PART MEASUREMENT
1205  BF 31                      STX    DATA.CYCLE    *  CYCLE.
1207  A1 17    NEXT.DET:         CMP    #23           *MODIFY THE ADDRESS FOR THE
1209  23 08                      BLS    NEXT1         * PART SERIAL & PART PARALLEL
120B  AE 0A                      LDX    #10           * ADDRESSING METHOD.
120D  BF 13                      STX    ADCA          *IF ADDRESS(IN REGISTER A)>23,
120F  AE 18                      LDX    #24           *THEN SERIAL ADDR=9,PARALLEL
1211  20 19                      BRA    FIX.ADDR      * ADDR=A-24.
1213  A1 0F    NEXT1:            CMP    #15           *IF ADDRESS>15 THEN SERIAL...
1215  23 08                      BLS    NEXT2         * ADDR=9,PARALLEL  ADDR=A-16.
1217  AE 09                      LDX    #9
1219  BF 13                      STX    ADC
121B  AE 10                      LDX    #16
121D  20 0D                      BRA    FIX.ADDR
121F  A1 07    NEXT2:            CMP    #7            *IF ADDRESS>7 THEN SERIAL ...
1221  23 06                      BLS    NEXT3         * ADDR=8,PARALLEL  ADDR=A-8.
1223  AE 08                      LDX    #8
1225  BF 13                      STX    ADCA
1227  20 03                      BRA    FIX.ADDR
1229  B7 13    NEXT3:            STA    ADCA          *IF ADDRESS<8 THEN SERIAL ...
122B  5F                         CLRX                 * ADDR=A,PAR. ADDR=DON'T CARE
122C  9F       FIX.ADDR:         TXA
122D  B0 12                      SUB    ADDR
122F  40                         NEGA
1230  B7 14                      STA    NADDR         *SAVE PARALLEL ADDRESS.
1232  1D 00    SEND.ADDR:        BCLR   CSBAR,ADC     *SELECT THE ADC
1234  AE 08                      LDX    #8            *X=NUMBER OF BITS TO TRANSFER.
1236  3F 15                      CLR    DATA          *INITIALIZE RECEIVED DATA TO 0
1238  A6 08                      LDA    #8            *(2)CLEAR OLD SERIAL ADDR BIT
123A  B4 13                      AND    ADCA          *(3) & GET A NEW ONE.
123C  BA 14                      ORA    NADDR         *(3)GET PARALLEL ADDR.(3 BITS)
123E  48       NEXT.ADDR:        LSLA                 *(3)MAKE ROOM FOR DATA BIT(#0)
123F  B7 00                      STA    ADC           *(4)S  ; ADDR TO ADC (CLK=LOW)
1241  38 13                      LSL    ADCA          *(5)P.  E FOR NEXT ADDR BIT.
1243  1A 00                      BSET   CLK,ADC       *SEND LO-TO-HI ADC I/O CLOCK.
1245  38 15                      LSL    DATA          *(5)PREPARE FOR NEXT DATA BIT.
1247  B6 00                      LDA    ADC           *(3)GET NEW DATA BIT (CLK=HI)
1249  A4 01                      AND    #DMASK        *(2)MASK ALL BUT DATA BIT.
124B  BA 15                      ORA    DATA          *(3)APPEND NEW BIT TO OLD DATA
124D  B7 15                      STA    DATA          *(4)SAVE RESULT
124F  A6 08                      LDA    #8            *(2)CLEAR OLD ADDRESS BIT &
1251  B4 13                      AND    ADCA          *(3)GET NEW SERIAL ADDR BIT
1253  1B 00                      BCLR   CLK,ADC       *SEND HI-TO-LO ADC I/O CLOCK.
1255  BA 14                      ORA    NADDR         *(3)GET PARALLEL ADDR (3 BITS)
1257  5A                         DECX                 *(3)UPDATE # BITS TO TRANSFER.
1258  26 E4                      BNE    NEXT.ADDR     *(3)IF BITS TO TRANSFER, DO IT
125A  1C 00                      BSET   CSBAR,ADC     *DESELECT ADC DURING CONVERT.
125C  B6 15                      LDA    DATA          *(3)
125E  BE 31                      LDX    DATA.CYCLE    *(3)IF PART #3 OF DATA CYCLE,
1260  5A                         DECX                 *(3)
1261  27 12                      BEQ    GOT.DATA      *(3)THEN GO TO "GOT.DATA",
1263  BF 31                      STX    DATA.CYCLE    *(4)ELSE UPDATE CYCLE COUNTER.
```

```
1265 A3 01                CPX    #1              *(2)IF PART #1 OF DATA CYCLE,
1267 27 07                BEQ    NO.ADDR         *(3)
1269 3A 12                DEC    ADDR            *(5)THEN POINT TO NEXT DETECTR
126B B6 12                LDA    ADDR            *(3)& GO SEND ITS ADDR WHILE
126D CC 1207              JMP    NEXT.DET        *(3)GETTING PREVIOUS ADDR DATA
1270 B7 17    NO.ADDR:    STA    INCIDENT        *(3)IF PART #2, STORE 1st DATA
1272 CC 1232              JMP    SEND.ADDR       *(3)& GO GET 2nd DATA.
1275 B7 18    GOT.DATA:   STA    REFLECTED       *(3)IF PART #3, STORE 2nd DATA
1277 BE 12                LDX    ADDR            *(3)& RETURN WITH ADVANCED
1279 81                   RTS                    *    ADDRESS (INPUT ADDR - 1)
*---------------------------------------------------------------
1300 54       STEP.MOTOR: LSRX                   *POINT TO MOTOR'S STATUS INFO
1301 E6 19                LDA    STATUS,X        *GET MOTOR STATUS
1303 BF 2A                STX    XSAVE           *SAVE POINTER TO STATUS.
1305 AE 08                LDX    #NUM.STEPS      *INIT. # STEPS TO MOVE MOTOR.
1307 BF 32                STX    STEP.COUNT
1309 B7 29                STA    ASAVE           *SAVE STATUS.
130B A4 03                AND    #LOCATION       *X=POINTER TO MOTOR LOCATION.
130D 97                   TAX
130E B6 29    NEXT.STEP:  LDA    ASAVE           *SET X TO POINT TO DESIRED...
1310 A1 04                CMP    #ROTATION       * MOTOR LOCATION FOR TUNING
1312 24 28                BCC    BACK.UP         * FORWARD OR BACKWARD.
1314 5C                   INCX
1315 A3 04                CPX    #4
1317 26 02                BNE    LOC.OK
1319 AE 00                LDX    #0
131B D6 1000  LOC.OK      LDA    FSTEP,X         *GET NEXT MOTOR LOCATION.
131E BF 33                STX    LAST.LOC        *SAVE POINTER TO NEXT LOCATION
1320 BE 2A                LDX    XSAVE
1322 E7 80                STA    MOTORS,X        *STEP MOTOR TO NEW LOCATION
1324 CD 1400              JSR    DELAY           *WAIT FOR MOTOR TO FINISH STEP
1327 BE 33                LDX    LAST.LOC        *X=POINTER TO MOTOR LOCATION.
1329 3A 32                DEC    STEP.COUNT      *IF MOTOR HASN'T MOVED...
132B 26 E1                BNE    NEXT.STEP       *REQUIRED # STEPS, DO THEM,
132D B6 29                LDA    ASAVE           *ELSE UPDATE MOTOR LOCATION IN
132F A4 FC                AND    #NOT.LOC        * MOTOR STATUS INFORMATION.
1331 B7 29                STA    ASAVE
1333 9F                   TXA
1334 BA 29                ORA    ASAVE
1336 BE 2A                LDX    XSAVE
1338 E7 19                STA    STATUS,X
133A 58                   LSLX                   *POINT BACK TO DETECTORS.
133B 81                   RTS                    *RETURN TO WHERE CALLED FROM.
133C 5A      BACK.UP:     DECX
133D A3 FF                CPX    #$FF
133F 26 DA                BNE    LOC.OK
1341 AE 03                LDX    #3
1343 20 D6                BRA    LOC.OK
*---------------------------------------------------------------
1400 B7 10    DE.         STA    DLY1            *(4)DL (21+(DELAYB*(15+
1402 A6 27                LDA    #DELAYB         *(2)    (DELAYA*6))))
1404 B7 11    DL2:        STA    DLY2            *(4)    MICROSECONDS.
1406 A6 28                LDA    #DELAYA         *(2)
1408 4A       DL1:        DECA                   *(3)
1409 26 FD                BNE    DL1             *(3)
140B B6 11                LDA    DLY2            *(3)
140D 4A                   DECA                   *(3)
140E 26 F4                BNE    DL2             *(3)
1410 B6 10                LDA    DLY1            *(3)
1412 81                   RTS
*---------------------------------------------------------------
                          END
```

We claim:

1. A method of automatically adjusting the resonant frequency of each of a plurality of adjustable cavity filters, wherein each filter can be fed with an incident power signal, comprising:
   (a) providing means for sensing power incident to each cavity filter;
   (b) providing means for sensing any power reflected from each cavity filter;
   (c) providing adjusting means; and
   (d) adjusting, if needed, the resonant frequency of each cavity filter in sequence by
      (1) forming a respective indicium related to reflected power from each such cavity filter;
      (2) comparing the formed indicium for each such cavity filter to a predetermined threshold;
      (3) adjusting the resonant frequency of the respective cavity filter in a plurality discrete steps by repeating the above steps (1)-(2) so long as the predetermined threshold exceeds the respective formed indicium; and
      (4) sensing when the formed indicium exceeds the threshold and continuing the adjusting of the respective cavity filter so long as the most recently formed indicium of reflected power is less than the immediately preceedingly formed indicium of reflected power.

2. An adjustable filter comprising:
   a plurality of independently cavity filters with each coupleable to a separate incident power applying transmitter;
   means for sensing incident and reflected power for each said cavity filter;
   means for determining a value of a ratio of said incident and reflected power for each said cavity filter;
   means for generating from selected ones of said values respective adjustment indicia for respective ones of said cavity filters; and
   means for adjusting each of said respective ones of said cavity filters in response to a said respective adjustment indicia to minimize reflected power.

3. The filter of claim 2 wherein said sensing means generates analog signals corresponding to incident and reflected power for each cavity and said means for determining includes
   means for converting each said analog signal to a digital signal representation; and
   means for dividing each respective incident power digital representation by a respective reflected power digital representation to determine the value of a corresponding digital ratio.

4. The filter of claim 3 wherein said adjusting means includes a displacable tuning member and means for converting at least selected ones of said values of said digital ratios to respective adjustment displacement of a respective one of said tuning members.

5. The filter of claim 3 wherein said dividing means includes means for sequentially determining the values of a plurality of digital ratios representative of a respective cavity.

6. The filter of claim 5 with said adjusting means being responsive to said sequentially formed values so as to sequentially adjust at least selected ones of said cavity filters one at a time.

7. The filter of claim 5 wherein each said cavity filter includes an adjustment motor with a rotatable adjustment shaft inserted at least in part into said cavity filter and with said adjusting means effecting each needed adjustment by causing a respective shaft to rotate in only a first direction.

8. An apparatus for controlling a plurality of independently adjustable cavity resonators, with each cavity resonator coupleable to a respective incident power applying transmitter, comprising:
   means for sensing a first indicia, corresponding to power reflected from each said cavity resonator, said means including analog multiplexer means;
   means for sensing a second indicia for each said cavity resonator corresponding to power incident to each said cavity;
   comparing means for determining the value of a ratio of said first and second indicia for at least one of said cavities, for comparing each said value to a predetermined threshold and for forming an adjustment parameter in response to each said comparison and
   means for adjusting at least a selected one of the cavity resonators, to compensate for changes in the output frequencies of respective transmitters, in response to a selected one of said adjustment parameters.

9. The apparatus of claim 8 including means for converting each said first and second indicia to a digital representation.

10. The apparatus of claim 9 with said ratio forming means including means for digitally calculating each said ratio.

11. The apparatus of claim 10 including means for digitally comparing each said ratio to the predetermined threshold.

12. The apparatus of claim 11 including means for digitally forming each said adjustment parameter.

13. The apparatus of claim 12 with said adjusting means including a displacable adjustment member and including output means for converting each said digitally formed adjustment parameter to a selected displacement of said member.

14. A control system for use with a plurality of independently adjustable cavity filters, with each filter coupleable to a separate transmitter, comprising:
   a plurality of pairs of first and second sensor means with each said pair of first and second sensor means coupled to a selected one of the cavity filters and an associated transmitter so as to sense respectively, power supplied to the cavity filter and power reflected therefrom;
   analog multiplexer means, coupled to said pairs of sensor means, for converting a plurality of input analog signals from said sensor means, indicative of power supplied to and reflected from a respective filter, to a temporal sequence of reflected analog output signals;
   analog-to-digital converter means for sensing said selected analog output signals and for generating a temporal sequence of digital representations thereof with each said digital representation corresponding to a respective cavity;

digital processing means, coupled to said converter means, for computing standing wave ratios for each cavity based on said digital representations, including means for comparing each said ratio to a predetermined threshold and means for adjusting each respective cavity in response to said comparison.

15. The apparatus of claim 14 wherein each of said cavity filters is a square prism filter, and wherein each includes a stepper motor mounted on a rectangular, non-square face of a respective one of the cavity filters, and each of the square prism filters shares a square wall with another of the square prism filters.

16. The apparatus of claim 15 wherein each of the square prism filters includes means extending through a rectangular non-square face on which its stepper motor is mounted into the interior of that square prism filter and supporting a conductive tuning element of that square prism filter.

17. An apparatus for controlling a plurality of independently adjustable cavity resonators, with each cavity resonator coupleable to a respective incident power applying transmitter, comprising:
   means for forming a first indicium, related to power reflected from each said cavity resonator, said means including analog multiplexer means;
   means for comparing each of selected ones of said first indicia to a predetermined value and for forming an adjustment parameter in response to each said comparison; and
   means for adjusting at least a selected one of the cavity resonators, to compensate for changes in the output frequencies of respective transmitters, in response to a selected one of said adjustment parameters.

18. An apparatus for automatically tuning the resonant frequency of an adjustable cavity filter being continuously fed with an incident power signal, the apparatus comprising:
   means for sensing power incident to the cavity filter;
   means for sensing power reflected from the cavity filter;
   means for forming a first electrical signal corresponding to a ratio of said sensed incident power to said sensed reflected power;
   means for comparing said first electrical signal to a predetermined threshold value and for generating a control signal indicative of the results of said comparison; and
   means, responsive to said control signal, for adjusting the resonant frequency of the cavity filter, simultaneously with the filter being continuously fed by the incident power signal to approach the frequency of the incident power signal when said control signal indicates that said threshold value exceeds said ratio.

19. An apparatus as in claim 18 wherein said adjusting means includes means for further varying the resonant frequency of the cavity filter when said ratio exceeds said threshold so as to minimize the power reflected therefrom.

20. An apparatus as in claim 18 wherein the cavity filter defines an internal region bounded by a plurality of walls, and said adjusting means generates motor control signals and further includes a movable conductive tuning element disposed in the internal region of the cavity filter and having external motor means coupled through a wall of the cavity filter for moving said conductive tuning element in response to said motor control signals applied to said motor means.

21. The apparatus of claim 18 wherein said adjusting means includes means for sequentially detecting the presence or absence of said control signal and for sequentially adjusting the cavity filter a predetermined amount each time the presence of said control signal indicates that said threshold value exceeds said ratio.

22. An apparatus for automatically tuning the resonant frequency of an adjustable cavity filter which can be fed with an incident power signal, the apparatus comprising:
   means for sensing power incident to the cavity filter;
   means for sensing power reflected from the cavity filter;
   means for forming a first electrical signal corresponding to a ratio of said sense incident power to said sensed reflected power;
   means for comparing said first electrical signal to a predetermined threshold value and for generating a control signal indicative of the results of said comparison;
   means responsive to said control signal, for adjusting the resonant frequency of the cavity filter to approach the frequency of the incident power signal when said control signal indicates that said threshold value exceeds said ratio,
   wherein the cavity filter defines an internal region bounded by a plurality of walls, and said adjusting means generates motor control signals and includes a movable conductive tuning element disposed in the internal region of the cavity filter and external motor means coupled through a wall of the cavity filter for moving said conductive tuning element in response to said motor control signals applied to said motor means; and
   including means for sequentially sensing and storing at least a current and a prior indicia of power reflected from the cavity filter as said conductive tuning element is moved and including means for comparing the current and prior indicia of reflected power and for generating an electrical signal indicative thereof, said adjusting means including means for continuing to move said tuning element when said control signal indicates that said ratio exceeds said threshold value in response to said electrical signal indicating that said current indicium of reflected power is less than said prior indicium of reflected power.

23. A method for automatically tuning the resonant frequency of an adjustable cavity filter, that can be continuously fed with an incident power signal, to match the frequency of the incident power signal, the method comprising:
   (a) continuously feeding the incident power signal to the cavity filter;
   (b) sensing the quantity of power of the signal incident to the filter;
   (c) sensing the quantity of power of any signal reflected from the filter;
   (d) forming a ratio of the quantity of incident power to the quantity of reflected power;
   (e) comparing the value of the formed ratio to a predetermined threshold value;
   (f) generating an electrical signal indicative of the threshold value exceeding the value of the ratio; and (g) adjusting the resonant frequency of the cavity filter by only a predetermined amount in response to the presence of the generated electrical signal and simultaneously with continuously feeding the incident power signal to the filter.

24. A method as in claim 23 including:
repeating steps (a) through (f) until the ratio exceeds the threshold value.

25. A method for automatically tuning the resonant frequency of an adjustable cavity filter, that can be fed with an incident power signal, to match the frequency of the incident power signal, the method comprising:
(a) sensing the quantity of power of the signal incident to the filter;
(b) sensing the quantity of power of any signal reflected from the filter;
(c) forming a ratio of the quantity of incident power to the quantity of reflected power;
(d) comparing the value of the formed ratio to a predetermined threshold value;
(e) generating an electrical signal indicative of the threshold value exceeding the value of the ratio; and
(f) adjusting the cavity filter by only a predetermined amount in response to the presence of the generated electrical signal;
including repeating steps (a) through (f) until the ratio comparison exceeds the threshold value and then
comparing the present quantity of the sensed, reflected power to a previous quantity of the sensed, reflected power and adjusting the resonant frequency of the cavity filter a predetermined amount if the quantity of the present sensed reflected power is less than the quantity of the previous sensed electrical power.

26. A method as in claim 25 including repeating the steps thereof so long as the quantity of the present sensed reflected power is less than the quantity of previous sensed reflected power.

* * * * *